(12) United States Patent
Sanchez et al.

(10) Patent No.: US 6,956,915 B2
(45) Date of Patent: Oct. 18, 2005

(54) METHOD OF CORRECTING FREQUENCY ERROR

(75) Inventors: Javier Sanchez, Reuil Malmaison (FR); Alexandre Da Rocha, Santa Clara, CA (US); Jean-Hugues Perrin, Argenteuil (FR)

(73) Assignee: Alcatel, Paris (FR)

( * ) Notice: Subject to any disclaimer, the term of this patent is extended or adjusted under 35 U.S.C. 154(b) by 775 days.

(21) Appl. No.: 09/986,549

(22) Filed: Nov. 9, 2001

(65) Prior Publication Data

US 2002/0057753 A1   May 16, 2002

(30) Foreign Application Priority Data

Nov. 10, 2000   (FR) .................................. 00 14476

(51) Int. Cl.⁷ .......................... H03D 1/04; H03D 1/06; H04B 1/10
(52) U.S. Cl. .................. 375/346; 375/350; 375/79; 375/344
(58) Field of Search ............... 375/365, 79, 344; 370/503, 203; 331/14; 455/196.1; 318/18

(56) References Cited

U.S. PATENT DOCUMENTS

| | | | |
|---|---|---|---|
| 3,308,360 A | * | 3/1967 | Vanderbilt .................. 318/592 |
| 4,236,249 A | * | 11/1980 | Burger ........................ 375/323 |
| 5,614,870 A | * | 3/1997 | Sauer et al. .................... 331/14 |
| 5,659,573 A | | 8/1997 | Bruckert et al. |
| 6,134,286 A | * | 10/2000 | Chennakeshu et al. ..... 375/365 |
| 6,219,333 B1 | * | 4/2001 | Ahn ............................. 370/203 |
| 6,373,861 B1 | * | 4/2002 | Lee .............................. 370/503 |
| 6,628,730 B1 | * | 9/2003 | Stott et al. ................... 375/344 |
| 6,816,716 B2 | * | 11/2004 | Shohara .................... 455/196.1 |

FOREIGN PATENT DOCUMENTS

| | | |
|---|---|---|
| EP | 0 812 066 A1 | 12/1997 |
| EP | 0 849 887 A2 | 6/1998 |
| WO | WO 99/59259 | 11/1999 |
| WO | WO 00/38343 | 6/2000 |

OTHER PUBLICATIONS

Saito S et al.: "Performance of QPSK coherent detection with dual-mode carrier recovery circuit for fast and stable carrier tracking" IEEE International Conference on Communications '88: Digital Technology Spanning the Universe. Conference Record (CAT. NO. 88CH2538-7), Philadelphia, PA, USA Jun. 12-15, 1988, pp. 735-741.

* cited by examiner

*Primary Examiner*—Stephen Chin
*Assistant Examiner*—Linda Wong
(74) *Attorney, Agent, or Firm*—Sughrue Mion, PLLC

(57) ABSTRACT

A method of correcting frequency errors for use in CDMA mobile radio terminals which is adaptive, depending on the value of the frequency error. There are thus three different frequency error correction processing modes: a processing mode with no correction, an open-loop processing mode for coarse correction, and finally a closed-loop processing mode for very accurate correction. The frequency error processing modes are selected by a central control unit as a function both of the value of the frequency error and of quality factor determined by a quality control unit of a channel coefficient filter.

11 Claims, 3 Drawing Sheets

METHOD OF CORRECTING FREQUENCY ERROR

The present invention relates to a method of correcting frequency errors in a code division multiple access (CDMA) mobile communications network in which the number of users of a base station is very closely related to power control in the network.

The invention relates more particularly to the field of telecommunications and especially to the field of radio terminals.

BACKGROUND OF THE INVENTION

The problem that arises is that of estimating and correcting frequency errors in a CDMA communications network. Frequency errors are due to various physical phenomena that involve the quartz crystal of an oscillator of a mobile radio terminal, thereby causing a frequency offset. These phenomena can be associated with temperature, gradual deterioration of the crystal at the atomic level, etc.

Because of these phenomena, the oscillator of the mobile radio terminal is not always synchronized to that of the base station. Frequency errors can then degrade performance in terms of the demodulation that recovers binary information, and can therefore lead to loss of data. Frequency errors also have a direct impact on performance in terms of propagation channel estimation.

Accordingly, with the aim of obtaining good frequency synchronization between the base station and the mobile radio terminal, a very accurate crystal can be used in the local oscillator of the terminal. However, the more accurate the crystal, the more costly. An oscillator provided with this kind of crystal is therefore too costly to envisage its use in the mass production of mobile radio terminals.

Another approach is to use frequency error correction for the base band part of the signal, i.e. the digital part of the signal, retaining a low-cost local oscillator using a conventional crystal for processing the radio-frequency signal. In this particular context, which is that of the invention, frequency error correction techniques exist already and are well known to the person skilled in the art. Such techniques can be divided into two types.

Firstly, there are techniques based on frequency domain analysis which highlights the frequencies of a complex signal and determines the amplitudes and phases of the corresponding partial signals. Thus a power spectrum is calculated by means of a fast Fourier transform. The offset of the spectrum relative to the 0 Hz frequency reference is evaluated from the power spectrum estimate obtained. It is then a question of centering the spectrum, with the aim of compensating the offset caused by the frequency error. Finally, an inverse fast Fourier transform effects a return to the time domain for continued processing of the corresponding signal.

Secondly, there are frequency error correction techniques based on analysis in the time domain. The frequency error is calculated for a common channel conveying information which is known to the mobile terminal. Correction is then applied symbol by symbol to the input signal. This step entails using a complex product of frequency error and input signal, calculated using sine and cosine functions.

The principal drawback of the frequency error correction techniques explained above is the very complex calculations that they require when implemented on a CDMA mobile terminal. What is more, none of the above solutions is also intended to address the problem of channel estimate filtering.

Accordingly, to regulate the complexity of the calculations, the invention proposes to alleviate the drawbacks of the prior art previously cited by providing a frequency error correction method intended to be used in CDMA mobile radio terminals which is adaptive, depending on the value of the frequency error. The invention therefore provides three correction modes for frequency error correction. A closed-loop mode corresponds to very accurate frequency error correction, an open-loop mode corresponds to coarse correction, and a final mode is entirely devoid of frequency error correction. This system matches the complexity of the frequency error correction calculations to what is required, without compromising performance in terms of demodulation.

OBJECTS AND SUMMARY OF THE INVENTION

The invention therefore provides a method of correcting frequency errors occurring in a multipath input signal of a receiver of a mobile radio terminal, the method using one of three different frequency error processing modes, respectively a processing mode with no frequency error correction, an open-loop processing mode for coarse frequency error correction, and a closed-loop processing mode for fine frequency error correction, the frequency error processing mode being selected by a central control unit as a function both of the value of the frequency error and of a quality factor determined by a quality control unit of a channel coefficient filter.

Another feature of the method of the invention is that it includes a preliminary step of estimating the frequency error occurring in the multipath input signal from the impulse response of the propagation channel of said input signal, said frequency error being estimated by way of an estimate of the phase error.

In one particular embodiment of the invention the frequency error is estimated with a variable period.

The estimated frequency error is filtered by using a plurality of frequency error estimates to obtain an averaged frequency error.

The quality factor is used to monitor the efficacy of channel coefficient filtering.

To this end, the quality factor is determined as a function of a signal-to-interference ratio.

The invention also provides a device for correcting the frequency error occurring in a multipath input signal of a receiver of a mobile radio terminal (REC) able to communicate with a remote sender via a propagation channel, the device comprising a central control unit adapted to use three different frequency error processing modes, respectively a processing mode with no frequency error correction, an open-loop processing mode for coarse frequency error correction, and a closed-loop processing mode for fine frequency error correction, the frequency error processing mode being selected by a central control unit as a function both of the value of the frequency error and of a quality factor determined by a quality control unit of a channel coefficient filter.

The device further comprises a frequency error estimator associated with a frequency error estimate filter to supply the frequency error value to the central control unit.

The device of the invention further comprises, for effecting coarse frequency error correction, both a channel estimate corrector adapted to supply the channel filter with an impulse response of the propagation channel free of the frequency error and a propagation channel impulse response processor adapted to reintroduce the frequency error into the filtered propagation channel impulse response.

Finally, the device according to the present invention further comprises, for fine frequency error correction, a closed loop consisting of an averaged frequency error filter associated with a frequency corrector which receives as input the multipath signal and supplies as output a multipath signal free of the frequency error.

BRIEF DESCRIPTION OF THE DRAWINGS

Other features and advantages of the invention will become more clearly apparent on reading the following description with reference to the drawings of one particular embodiment, in which drawings.

MORE DETAILED DESCRIPTION

Figure 1:
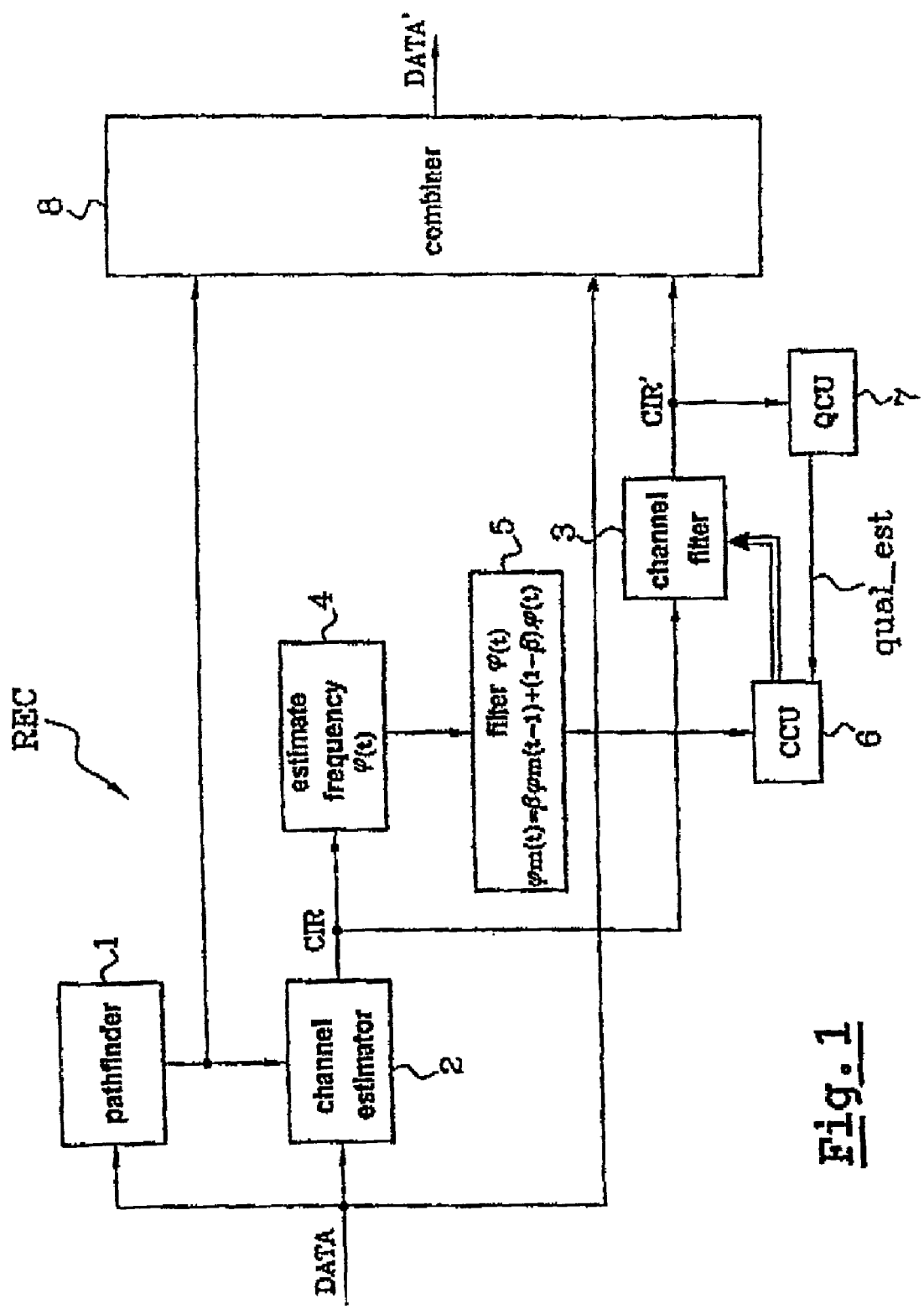
FIG. 1 is a block diagram of a rake receiver in a mobile radio system when no frequency correction is applied.
Figure 2:
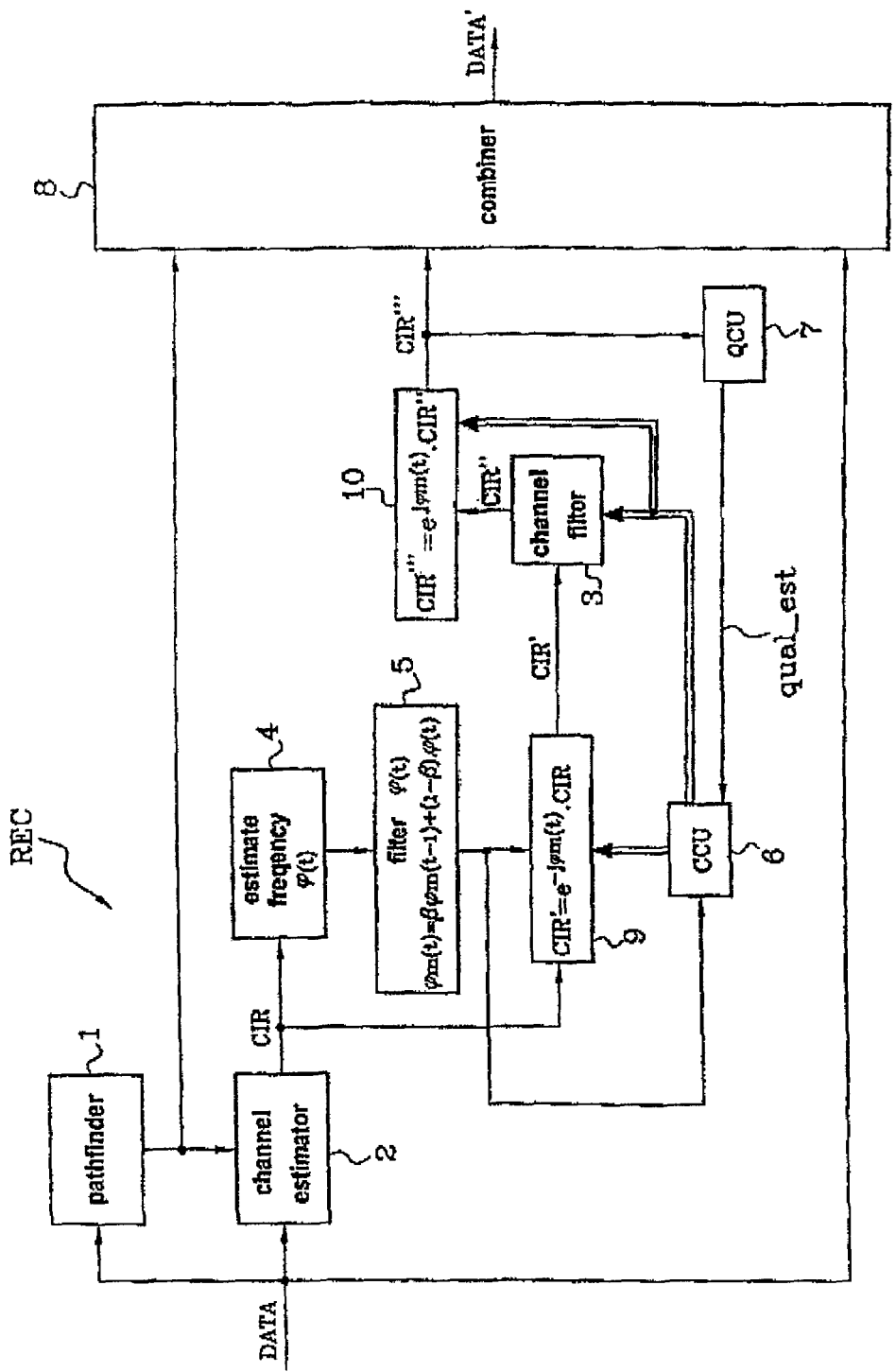
FIG. 2 is a block diagram of a receiver when open-loop frequency correction is applied.
Figure 3:
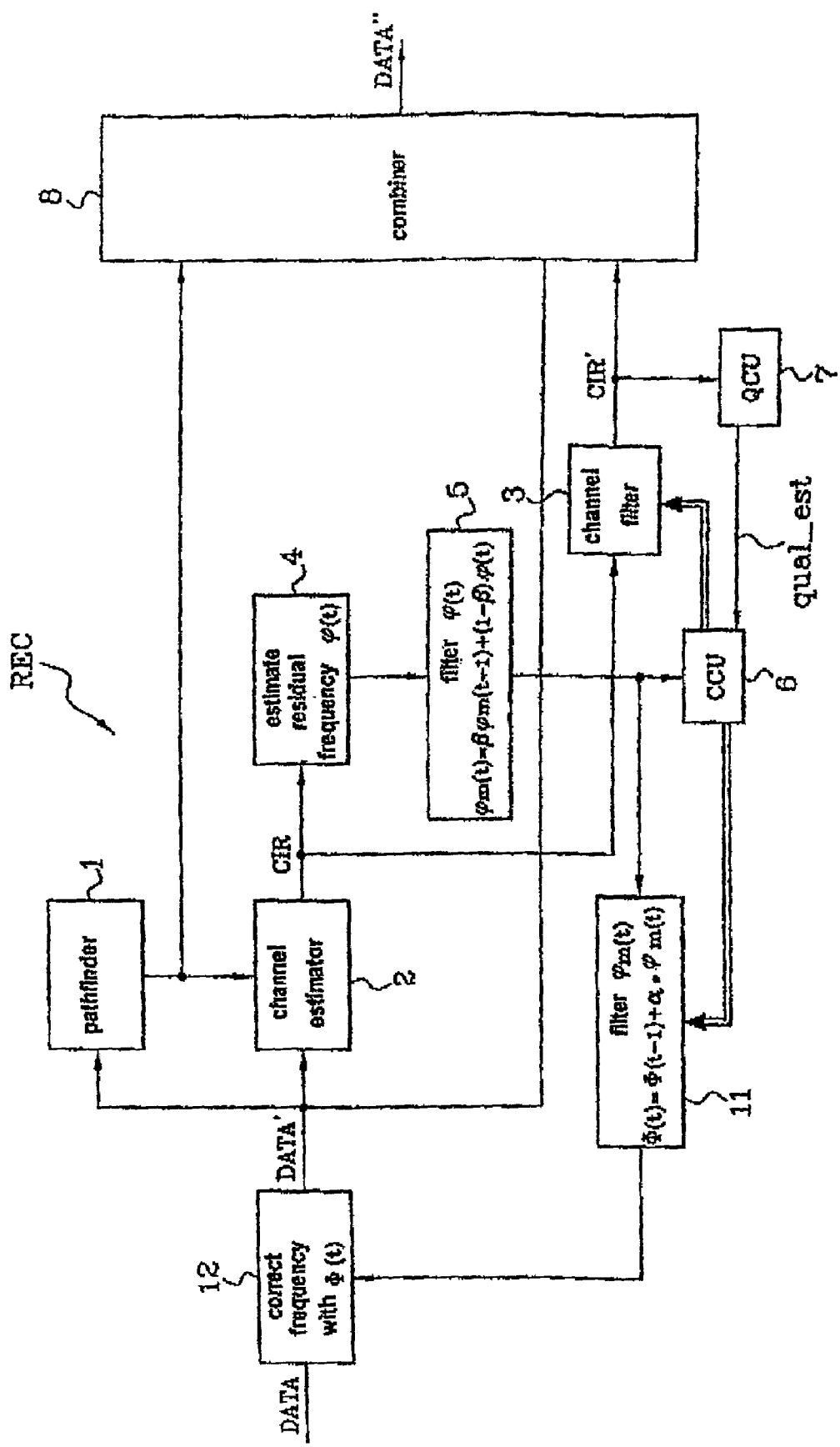
FIG. 3 is a block diagram of a receiver when closed-loop frequency correction is applied.

FIGS. 1, 2 and 3 each show one of three exclusive processing modes of a frequency error correction method in accordance with the present invention. Thus they illustrate the three scenarios used by the method of the invention. All units and components common to FIGS. 1, 2 and 3 retain the same reference numbers therein.

In FIG. 1, an input signal containing payload data sent by a distant sender, and referred to hereinafter as the signal DATA, is applied to the input of a receiver REC of a mobile radio terminal. It is fed to an input of a pathfinder 1, to a first input of a channel estimator 2, and to a first input of a combiner 8. The signal DATA is a multipath signal. The pathfinder 1 has an output connected to a second input of the channel estimator 2 and to a second input of the combiner 8.

The channel estimator 2 has an output connected to a first input of a channel filter 3 and to an input of a frequency error estimator 4. The channel filter 3 has an output connected to a third input of the combiner 8 and to an input of a quality control unit (QCU) 7.

The frequency error estimator 4 has an output connected to an input of a frequency error estimate filter 5. The frequency error estimate filter 5 has an output connected to a first input of a central control unit (CCU) 6. The central control unit 6 has a second input connected to the output of the quality control unit 7. The central control unit 6 supplies a control signal to the channel filter 3.

The radio signal propagates over one or more paths because of obstacles from which the waves ricochet before they reach their destination. They therefore arrive with different phases.

Also, the waves arriving with a time-delay have traveled a longer path and their amplitude may consequently be more attenuated.

The signal therefore reaches the mobile radio terminal with phase distortion and possibly with amplitude distortion.

The role of the pathfinder 1 is to estimate the time-delays in the transmission of the signals due to the multipath phenomenon explained above. To this end, the pathfinder 1 uses a power estimate for each path from which the time-delays can be deduced. The pathfinder 1 receives the multipath signal DATA as input and supplies the power profile of the signal DATA over a particular time period as output, after processing by various algorithms in a manner known to the person skilled in the When the time-delays have been determined by the processing effected by the pathfinder 1, the channel estimator 2 supplies an estimate of the impulse response of the propagation channel. In other words, the function of the channel estimator 2 is to determine the amplitudes and the phases of each path. A channel estimate is obtained for each time slot, corresponding in the present context to a time period of 0.6 millisecond.

To be able to provide the estimate of the impulse response of the propagation channel, the channel estimator 7 must receive as input the multipath signal DATA and the time-delays calculated by the pathfinder 1. To determine the amplitude and the phase of the signal for each path, the channel estimator 2 must know the value of the time-delay for each path. The amplitude and the phase for each path are then represented by a complex coefficient. The set of coefficients representing the amplitude and the phase for each path constitute the impulse response of the propagation channel, also referred to as the channel impulse response (CIR).

The signal CIR at the output of the channel estimator 2 is then fed to the frequency estimator 4. The function of the unit 4 is to determine the instantaneous frequency error. In concrete terms, the frequency error is reflected in a rotation of the multipath signal with a continuous phase increment $\phi$. The problem of estimating the frequency error can therefore be treated as a problem of estimating the phase error.

The instantaneous phase error $\phi(t)$ is calculated in the unit 4 from the phase difference between two consecutive channel estimates obtained at times $t$ and $t+1$. Thus the phase error is estimated in each time slot.

In a preferred embodiment of the invention, the estimate of the phase error caused by the frequency error is effected on the most powerful path, i.e. the path on which the received power level is highest.

However, in the context of the universal mobile telecommunication system (UMTS), frequency division duplex (FDD) standard, ten channel estimates are effected for each time slot and are then averaged.

In the context of the above standard, the channel estimate for each slot therefore corresponds to an average of ten channel estimates. The value of $\phi(t)$ is then estimated from that average value. The frequency error in a slot can already be sufficiently large for it to be impossible to recover the data.

Accordingly, in a different embodiment of the invention, the phase error can be calculated with a variable period. The value of $\phi(t)$ can then be estimated, not after ten channel estimate values, but instead after five channel estimate values, for example.

The instantaneous phase error $\phi(t)$, representative of the frequency error, is then filtered in the filter 5 to eliminate random phase errors and phase errors due to the Doppler effect. The instantaneous phase error $\phi(t)$ is therefore averaged over a plurality of estimates by means of a conventional low-pass filter with the following equation:

$$\phi m(t) = \beta \cdot \phi m(t-1) + (1-\beta) \cdot \phi(t), \text{ with } 0 < \beta < 1$$

The averaged phase error $\phi m(t)$, which represents the averaged frequency error, is then fed to the CCU 6, which determines if the phase error is large enough to degrade demodulation performance. Thus the combination of the frequency error estimator 4 and the frequency error estimate filter 5 supplies the value of the frequency error to the central control unit 6.

If the phase error φm(t) is not considered to be high enough by the CCU, a processing mode with no frequency error correction is applied. The central control unit 6 then sends a control signal to the channel coefficient filter 3 instructing it to ignore the frequency error. Filtering the channel estimates in the filter 3 takes account of the Doppler effect, i.e. the error in estimating the channel coefficients due to the speed at which the radio terminal is moving. Thus the channel filter 3 filters the channel estimates as a function of the speed of the radio terminal. In this processing mode with no error correction, the offset due to the frequency error that is added to the Doppler shift is not considered to be a problem.

The CCU then commands use of one of a restricted number of channel filtering options: high speed, average speed, low speed and, finally, total absence of channel filtering.

The channel estimate filter 3 therefore filters the channel coefficients from the channel estimator 2 to obtain filtered channel coefficients and thereby attenuate channel coefficient estimation errors due to the Doppler effect. The channel estimate filter 3 supplies as output an improved channel impulse response CIR' which takes account of the speed at which the mobile radio terminal is moving. The signal CIR' is then fed to the combiner 8 and to the quality control unit 7.

The role of the quality control unit 7 is to determine a filtered channel estimate quality factor qual_est that is a function of the signal-to-interference ratio SIR. The quality factor qual_est is used to monitor the efficacy of channel coefficient filtering by the filter 3. The QCU 7 supplies the quality factor qual_est to the CCU 6, which also takes this parameter into account in deciding to use the frequency error processing mode with no error correction.

The CCU therefore bases its choice of a frequency error processing mode, both on the frequency error value, which is represented by the averaged phase error φm(t), and on the value of the quality factor qual_est.

The combiner 10 then combines all the paths into a single path in a coherent manner, i.e. correcting phase errors and time-delays. The combiner 10 delays the signals that reach it first so that it can take into account subsequently those that arrive with a time-delay, so that all the signals can be combined at the same time, with phase correction.

To this end, the combiner 10 calculates a complex product of the signal DATA and the conjugate value of the filtered impulse response CIR' of the propagation channel. It supplies a signal DATA' of increased power as output.

However, if the frequency error is great enough for it to be necessary to envisage frequency correction, the CCU 6 can command the use of an open-loop frequency error processing mode that corresponding to coarse frequency error correction. The open-loop frequency error processing mode is described with reference to FIG. 2. It corresponds to an intermediate level of calculation complexity, compared to the preceding frequency error processing mode, in which no error correction was envisaged, and relative to the processing mode described later with reference to FIG. 3, which employs very precise closed-loop frequency error correction.

A channel estimate corrector 9 is therefore provided between the channel estimator 2 and the channel filter 3. The channel estimate corrector 9 receives as input, both the signal CIR from the channel estimator 2, representing the impulse response of the propagation channel, and the averaged phase error φm(t) from the φ(t) filter 5. The channel estimate corrector 9 supplies a corrected signal CIR' as output to the channel filter 3.

A propagation channel impulse response processor 10 receives a signal CIR" from the channel filter 3 as input and supplies a signal CIR'" as output to the combiner 8.

Finally, the CCU 6 supplies a control signal to the units 9, 3 and 10.

As in the previous mode of processing without error correction described with reference to FIG. 1, the CCU receives the averaged phase error value φm(t) from the φ(t) filter 5. In this open-loop processing mode, the CCU deems that the phase error φm(t) is sufficiently high to necessitate frequency correction. The CCU then sends a control signal to the corrector 9.

Correcting the frequency error consists of calculating a complex product of the coefficients of the channel estimate CIR and the complex number $e^{-j\phi m(t)}$. The complex product $e^{-j\phi m(t)} \times CIR$ thus resynchronizes the phases of the channel coefficients relative to the averaged phase error φm(t), and filtering of the channel coefficients in the unit 3 is therefore not disturbed by the frequency error and takes account only of the Doppler effect. The unit 9 eliminates the contribution of the frequency error to the impulse response CIR of the propagation channel. The unit 9 therefore supplies the impulse response CIR' of the propagation channel less the frequency error as output to the filter 3.

It must be noted that this processing mode applies the same phase error φm(t) without distinction to all the symbols that are in the slot when the channel coefficients are resynchronized in phase in the unit 9. This is because φm(t) corresponds to an average estimate over all the slots. The open-loop processing mode therefore uses coarse frequency error correction, but nevertheless proves sufficient in many of the situations determined by the CCU.

The impulse response CIR' of the channel resynchronized in phase by the unit 9 is then supplied to the channel filter 3 which, after receiving the control signal sent by the CCU, filters the channel coefficients to allow for the Doppler effect. The signal CIR" at the output of the channel filter 3 therefore corresponds to the impulse response of the filtered propagation channel taking into account both the phase error and the error due to the Doppler effect.

The signal CIR" is then supplied to the processor 10 whose role is to reintroduce the phase error representative of the frequency error into the signal CIR" in order for the combiner 10 to take it into account. The combiner 10 then calculates a complex product of the signal DATA and the filtered channel coefficients in order to provide as output a signal DATA' of increased power.

Under the control of a control signal sent by the CCU, the unit 10 therefore calculates a complex product of the filtered coefficients of the signal CIR" and the complex number $e^{-j\phi m(t)}$. The complex product $e^{-j\phi m(t)} \times CIR$ yields an impulse response CIR'" into which the phase error has been reintroduced. The processing in the combiner 8 can be carried out without errors.

Finally, on the basis of the signal CIR'", the QCU determines the quality factor qual_est as a function of the signal-to-interference ratio. The quality factor qual_est is used to verify the efficacy of channel filtering and is supplied to the CCU. Looping the QCU back to the CCU therefore provides additional system control and refines the frequency error processing mode.

Finally, a final processing mode proposed by the invention is the closed-loop processing mode shown in FIG. 3. This processing mode takes into account high frequency errors that necessitate very accurate correction. It therefore corresponds to the processing mode offering the highest performance, but entails more complex calculations than the preceding processing modes.

Compared to the FIG. 1 diagram, the FIG. 3 diagram includes a closed loop consisting of a unit 11 for filtering the averaged frequency error φm(t) associated with a frequency corrector 12. The unit 11 receives at a first input a signal from the filter 5 for filtering the instantaneous phase error φ(t) and on a second input a control signal from the CCU 6.

The unit 11 has an output connected to a first input of the frequency corrector 12. The frequency corrector 12 has a second input to which the signal DATA is supplied. The frequency corrector 12 finally includes an output supplying a signal DATA' and connected both to an input of the channel estimator 2 and to an input of the combiner 8.

As previously, the CCU 6 receives both the value of the averaged phase error φm(t) from the filter 5 and the value of the quality factor qual_est calculated by the QCU 7. If these values exceed a particular predetermined threshold, which implies excessive degradation of demodulation, the CCU commands application of the closed-loop processing mode.

The CCU then supplies a control signal to the filter 11 to begin closed-loop frequency error processing, which continues until the loop converges. The convergence time of the loop is of the order of a few milliseconds.

The unit 11 filters the averaged phase error φm(t) in accordance with the follow filter equation:

$$\phi(t)=\phi(t-1)+\alpha \cdot \phi m(t), \text{ with } 0 \leq \alpha \leq 1$$

The CCU determines the value of α as a function of the required rate of convergence in the loop.

The value of φ(t) is then supplied to the frequency corrector 12, which calculates a complex product of the value $e^{-j\phi(t)}$ and the complex signal DATA to resynchronize its phase. Unlike the open-loop processing mode, frequency correction is effected directly on the signal DATA, and not on the impulse response of the propagation channel. Frequency correction is therefore applied symbol by symbol, and all the symbols are therefore resynchronized in phase. The closed-loop processing mode is therefore very accurate, although it is more costly than the first two kinds of processing mode in terms of calculation complexity.

On leaving the corrector 12, the signal DATA' is supplied to the channel estimator 2 that provides the impulse response of the propagation channel CIR on the basis of the signal DATA' less the frequency error. The residual frequency error is then estimated by the residual frequency estimator 4 and on the basis of the channel impulse response CIR. The residual error estimate is filtered in the filter 5 and then supplied to the CCU. The CCU commands continued closed-loop processing until the residual frequency error disappears.

When the loop has converged, the signal DATA' is clean in terms of frequency error. Conventional processing of the signal DATA' by the pathfinder 1 and the channel estimator 2 occurs as if there had not been any frequency error. The channel coefficients are then filtered by the channel filter 3 under the control of a control signal sent by the CCU. The combiner 8 can then process the signal DATA' and supply as output a signal DATA" of increased power.

The method according to the invention therefore manages two problems at the same time: frequency error correction and channel estimate filtering. It avoids the problems associated with the frequency offset due to the frequency error, which is added to the Doppler shift, thereby degrading the efficacy of channel filtering. The method according to the invention finds an optimum compromise between demodulation performance and the complexity of the calculations necessitated by frequency error correction. The performance of the demodulator is very closely associated with the choice of a channel filtering mode and with the accuracy of frequency correction.

What is claimed is:

1. A method of correcting frequency errors occurring in a multipath input signal of a receiver of a mobile radio terminal, the method using one of three different frequency error processing modes, respectively a processing mode with no frequency error correction, an open-loop processing mode for coarse frequency error correction, and a closed-loop processing mode for fine frequency error correction, the frequency error processing mode being selected by a central control unit as a function both of the value of the frequency error and of a quality factor determined by a quality control unit of a channel coefficient filter.

2. A method according to claim 1, including a preliminary step of estimating the frequency error occurring in the multipath input signal from an impulse response of a propagation channel of said input signal, said frequency error being estimated by way of a phase error estimate.

3. A method according to claim 2, wherein the phase error caused by the frequency error is estimated on the most powerful path.

4. A method according to claim 2, wherein the frequency error is estimated with a variable period.

5. A method according to claim 2, wherein the estimated frequency error is filtered in accordance with a plurality of frequency error estimates to obtain an averaged frequency error.

6. A method according to claim 1, wherein the quality factor is used to monitor the efficiency of channel coefficient filtering.

7. A method according to claim 6, wherein the quality factor is determined as a function of a signal-to-interference ratio.

8. A device for correcting frequency errors occurring in a multipath input signal of a receiver of a mobile radio terminal able to communicate with a remote sender via a propagation channel, the device comprising a central control unit adapted to use three different frequency error processing modes, respectively a processing mode with no frequency error correction, an open-loop processing mode for coarse frequency error correction, and a closed-loop processing mode for fine frequency error correction, the frequency error processing mode being selected by a central control unit as a function both of the value of the frequency error and of a quality factor determined by a quality control unit of a channel coefficient filter.

9. A device according to claim 8, further comprising a frequency error estimator associated with a frequency error estimate filter to supply the frequency error value to the central control unit.

10. A device according to claim 8, further comprising, for effecting the coarse frequency error correction, both a channel estimate corrector adapted to supply the channel filter with an impulse response of the propagation channel free of the frequency error and a propagation channel impulse response processor adapted to reintroduce the frequency error into the filtered propagation channel impulse response.

11. A device according to claim 8, further comprising, for fine frequency error correction, a closed loop consisting of an averaged frequency error filter associated with a frequency corrector which receives as input the multipath signal and supplies as output a multipath signal free of the frequency error.

* * * * *